United States Patent
Baney et al.

(10) Patent No.: US 7,179,668 B2
(45) Date of Patent: Feb. 20, 2007

(54) TECHNIQUE FOR MANUFACTURING SILICON STRUCTURES

(75) Inventors: William J. Baney, Kokomo, IN (US); Dan W. Chilcott, Greentown, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/113,554

(22) Filed: Apr. 25, 2005

(65) Prior Publication Data
US 2006/0240583 A1 Oct. 26, 2006

(51) Int. Cl.
*H01L 21/00* (2006.01)
*H01L 21/44* (2006.01)

(52) U.S. Cl. ............. 438/22; 438/48; 438/51; 438/106

(58) Field of Classification Search ........ 438/106–107, 438/22–24, 48, 50–53
See application file for complete search history.

(56) References Cited

U.S. PATENT DOCUMENTS

| | | | |
|---|---|---|---|
| 4,975,390 A | 12/1990 | Fujii et al. .......... | 437/228 |
| 6,829,814 B1 * | 12/2004 | Freeman et al. ....... | 29/594 |
| 2002/0179563 A1 | 12/2002 | Horning et al. ......... | 216/2 |
| 2003/0079547 A1 | 5/2003 | Baek ................. | 73/716 |

FOREIGN PATENT DOCUMENTS

| JP | 08236788 A | 9/1996 |
|---|---|---|
| JP | 2000039371 A | 2/2000 |

OTHER PUBLICATIONS

EP 06 07 5842; European Search Report dated Feb. 8, 2006.

* cited by examiner

*Primary Examiner*—Hsien-Ming Lee
(74) *Attorney, Agent, or Firm*—Jimmy L. Funke (57) ABSTRACT

A technique for manufacturing silicon structures includes etching a cavity into a first side of an epitaxial wafer. A thickness of an epitaxial layer is selected, based on a desired depth of the etched cavity and a desired membrane thickness. The first side of the epitaxial wafer is then bonded to a first side of a handle wafer. After thinning the epitaxial wafer until only the epitaxial layer remains, desired circuitry is formed on a second side of the remaining epitaxial layer, which is opposite the first side of the epitaxial wafer.

21 Claims, 8 Drawing Sheets

TECHNIQUE FOR MANUFACTURING SILICON STRUCTURES

TECHNICAL FIELD

The present invention is generally directed to silicon structures and, more specifically, to a technique for manufacturing silicon structures.

BACKGROUND OF THE INVENTION

A variety of techniques have been utilized to manufacture silicon micro-electro mechanical (MEM) structures, which are now utilized in a variety of applications to perform a number of functions. For example, MEM structures have been utilized in pressure sensors that are currently employed in many automotive and consumer products. A common technique for manufacturing silicon pressure sensors has involved forming sense elements on top of a silicon wafer and wet etching through a back side of the wafer (to an etch stop layer) to create a thin silicon membrane, under the sense elements. The sense elements, e.g., piezoresistive or capacitive implants, are implemented to sense a deflection of the membrane. In a typical process, the wet etch leaves a 125.3 degree angled sidewall at the edge of the membrane.

The wafer is then bonded to a second substrate, e.g., a glass plate, to isolate the membrane from stresses, e.g., packaging stresses. The second substrate is either solid (for absolute pressure sensing) or has been pre-drilled with a hole placed under the membrane (for differential pressure sensing). While this technique has proven relatively successful, the area of the sensor has been larger than electrically necessary, due to the constraints imposed by the wet etch, which follows the crystalline planes of the silicon and typically provides a membrane having a diameter of about 500–1500 microns. While a dry backside etch could be utilized to etch all of the crystalline planes equally and, thereby, reduce sensor area, there are currently no reliable etch stops that adequately maintain membrane thickness for current dry etch processes.

Another technique that has been implemented, to get around size limitations of the backside cavity process for forming pressure sensors, has first formed a cavity in the top side of a first wafer, i.e., used a cavity-on-top process, to form the sensor. In this process, a second wafer (with an epitaxial layer having the thickness of the desired membrane) is then bonded to the first wafer. After bonding the wafers, the second wafer is thinned leaving the epitaxial silicon layer, which forms the membrane over the cavity in the first wafer. While this process reduces the size of the membrane, an angle at the membrane interface is only approximately 54.7 degrees. As such, sensors made with this process have a less robust membrane, as the membrane is not as well supported as a sensor made with the backside cavity process. Furthermore, while the cavity-on-top version of the sensor has been successfully used to create absolute pressure sensors, the lack of an etch stop on the underside of the membrane makes it difficult to create differential pressure sensors using the cavity-on-top process.

Yet another technique for manufacturing sensors has used surface micromachining of semiconductor thin films and undercutting of a sacrificial layer to free the membrane of the sensor. Unfortunately, stress control of thin film membranes is generally inferior to stress control of single-crystal silicon membranes.

What is needed is a technique for manufacturing silicon micro-electro mechanical structures that can provide a relatively small, robust and multiple-use sensor.

SUMMARY OF THE INVENTION

The present invention is generally directed to a technique for manufacturing silicon structures. According to one embodiment, a cavity is etched into a first side of an epitaxial wafer. The thickness of an epitaxial layer is selected, based on a desired depth of the etched cavity and a desired membrane thickness. The first side of the epitaxial wafer is bonded to a first side of a handle wafer. After bonding the wafers, the epitaxial wafer is thinned, leaving only the epitaxial layer attached to the handle wafer. Desired circuitry is then formed on the epitaxial layer.

According to this aspect of the present invention, the handle wafer is at least one of a P++ type silicon wafer and a silicon wafer having a (111) Miller Indices. The technique may also include the additional step of forming a hole through the handle wafer from a second side of the handle wafer to the first side of the handle wafer approximate the cavity in the epitaxial wafer. In this embodiment, an oxide layer on the underside of the epitaxial layer functions as an etch stop layer and, thus, allows a differential type silicon structure to be manufactured. The hole may be formed using a deep reactive ion etch (DRIE).

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF PREFERRED EMBODIMENTS

According to the present invention, a sensor is manufactured by forming a cavity in an epitaxial wafer that is then bonded to a handle wafer. Forming the cavity in this manner allows an angle of sidewall of the cavity at a membrane (diaphragm) edge to be about 125.3 degrees. In general, the epitaxial layer thickness is selected to be substantially equal to the sum of the desired membrane thickness and the etched cavity depth. During the process, the presence of an oxide on the underside of the cavity etched into the epitaxial layer creates an etch stop for either wet or dry through-wafer etching, after bonding of the handle wafer and epitaxial wafer, thus, allowing a manufacturer to readily produce a differential pressure sensor, if desired.

Figure 1:
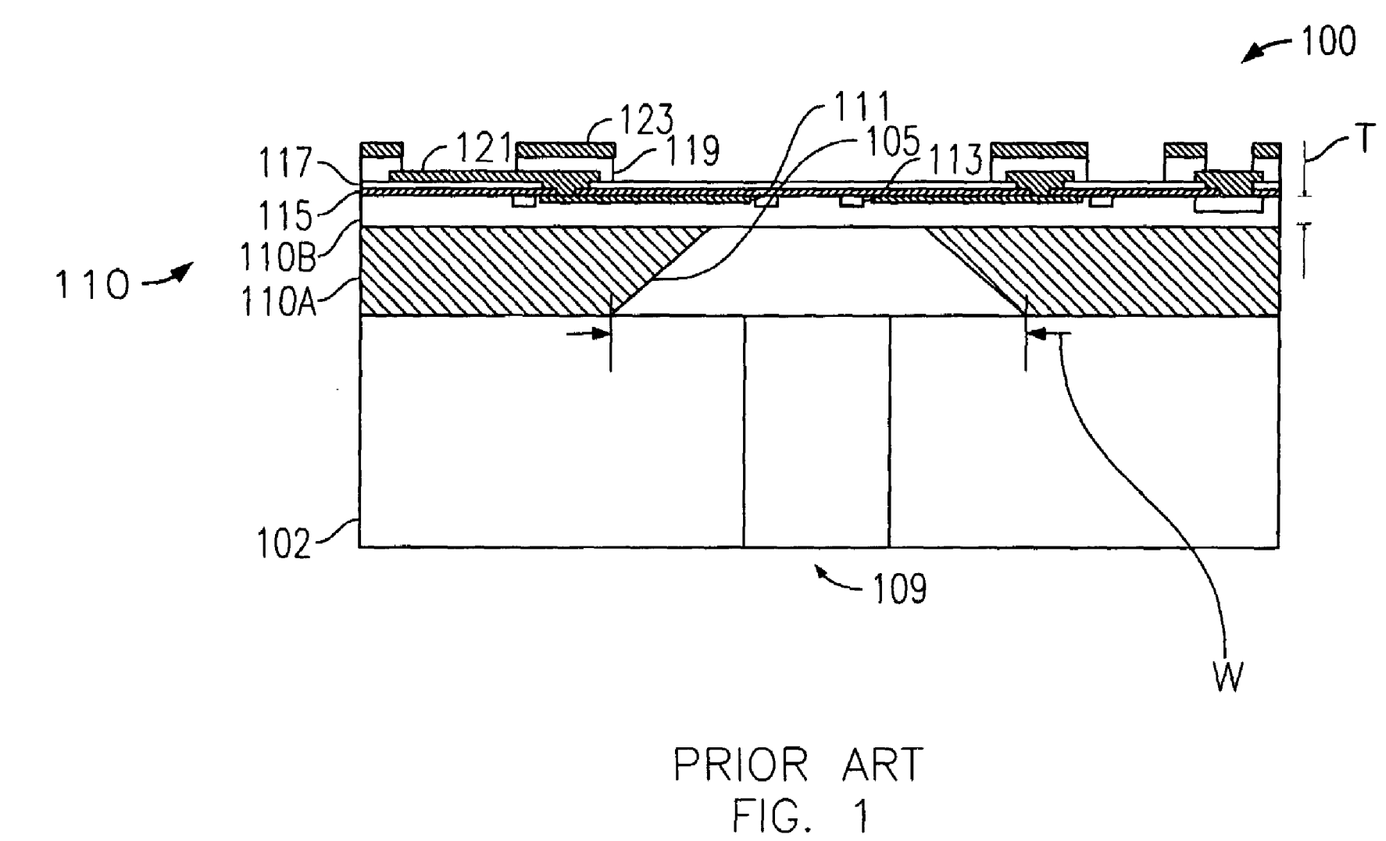
FIG. 1 is a cross-sectional view of a relevant portion of an exemplary prior art pressure sensor manufactured through a backside cavity process.

With reference to FIG. 1, a prior art pressure sensor 100, produced using a backside cavity process, is depicted. As is shown, a stress-relief substrate, e.g., a glass wafer, 102 is bonded to a silicon wafer 110, which includes an N-type epitaxial layer, which forms a membrane 110B having a thickness T. Prior to bonding of the wafers 102 and 110, a cavity having a sidewall 105 is formed into a backside of a portion 110A of the wafer 110. In a typical application, the width W of the cavity at the point of the membrane 110B is approximately 500–1500 microns. As is shown, the sidewall 105 forms an angle of approximately 125.3 degrees, with respect to the membrane 110B. For differential sensing, a hole 109 may be located through a backside of the stress-relief wafer 102 approximate the cavity.

Implanted or diffused into the membrane 110B are a plurality of impurity regions 111, which may be, for example, piezoresistive elements. Dielectric layers 115 and 117 and a metal layer, e.g., an aluminum silicon layer, 121 are formed over the silicon surface to provide insulation and contacts 113 for the impurity regions 111. Other dielectric layers 119 and 123 are formed over the metal layer 121 to provide protection for the metal. While the sensor 100 provides an angle of about 125.3 degrees at the interface between the sidewall 105 and the membrane 110B, a width W of the cavity opening consumes a larger silicon area than the membrane, increasing the size and, therefore, the cost of the sensor.

Figure 2:
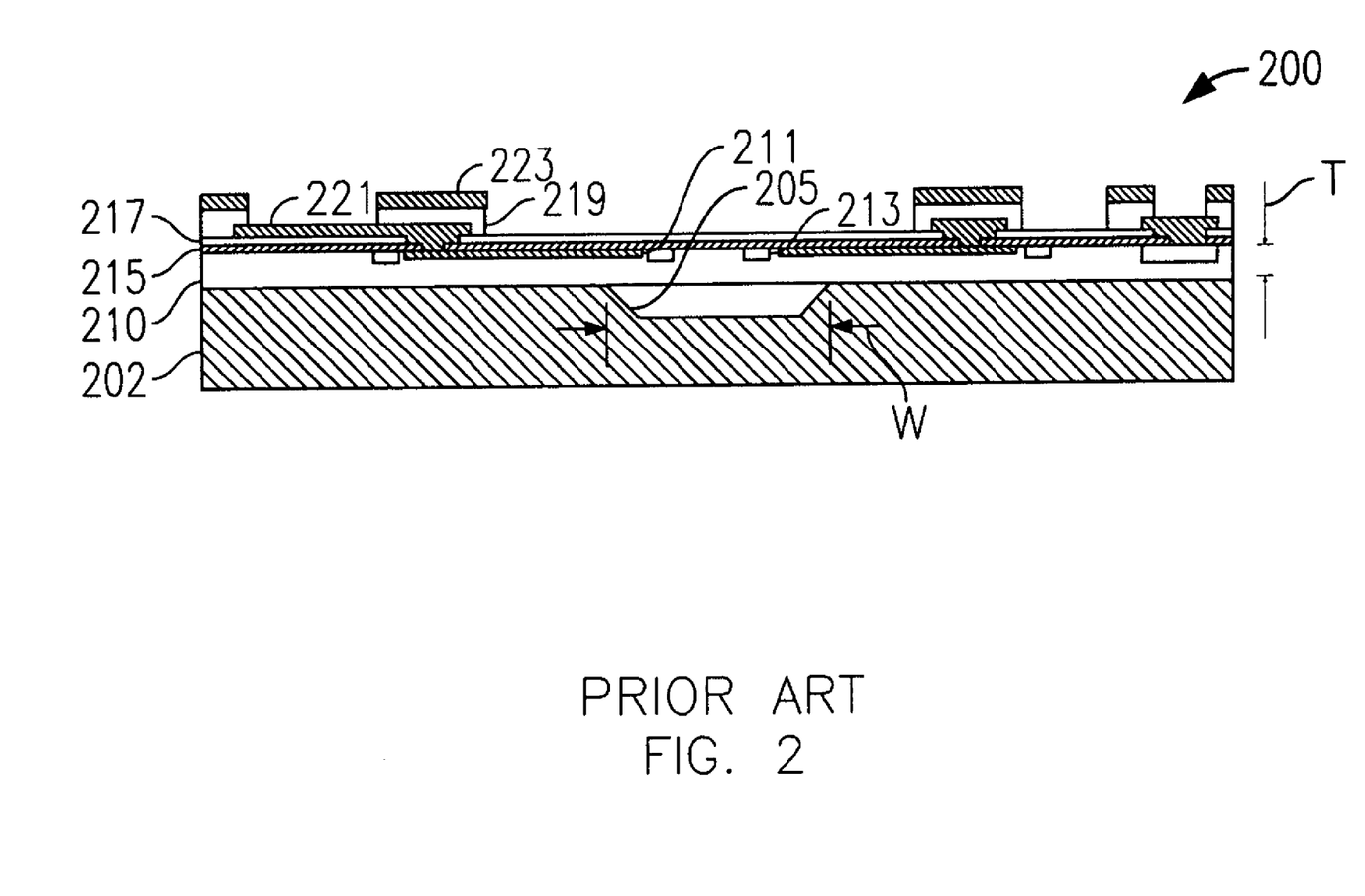
FIG. 2 is a cross-sectional view of a relevant portion of an exemplary prior art pressure sensor manufactured via a cavity-on-top process.

With reference to FIG. 2, a relevant portion of a pressure sensor 200, fabricated using the cavity-on-top process, is depicted. As is shown in FIG. 2, the sensor 200 includes a first wafer 202, which has a cavity formed therein, and a bonded N-type silicon layer 210, which is formed as previously described. The layer 210 provides a membrane for the sensor 200. The construction of the sensor 200 is similar to that of the sensor 100 of FIG. 1, with the exception that a sidewall 205 of the cavity meets the membrane 210 at an angle of approximately 54.7 degrees. As is shown in FIG. 2, the width W of the cavity is the same size as the membrane, which allows the dimensions of the pressure sensor 200 to be reduced, as compared to the sensor 100. Thus, the sensor 200 utilizes less silicon area and, as such, provides a sensor having a lower cost. However, due to the angle at which the sidewall 205 meets the membrane 210, the membrane of the sensor 200 is less robust than the membrane 110B of the sensor 100. The circuitry formed in/on the membrane 110B of the sensor 100 is similar to the circuitry formed in/on the membrane (i.e., epitaxial layer) 210 of the sensor 200.

In a manner similar to that described hereinabove pertaining to the pressure sensor 100 of FIG. 1, implanted or diffused into the N-type silicon layer 210 of the pressure sensor 200 (FIG. 2) are a plurality of impurity regions 211, which may be, for example, piezoresistive elements. N-type silicon layer 210 has a thickness T. Dielectric layers 215 and 217 and a metal layer, e.g., an aluminum silicon layer, 221 are formed over the silicon surface to provide insulation and contacts 213 for the impurity regions 211. Other dielectric layers 219 and 223 are formed over the metal layer 221 to provide protection for the metal.

FIG. 3 depicts a cross-sectional view of an epitaxial wafer 302, which includes two epitaxially deposited layers, i.e., an N-type layer 306 deposited over a P+ epitaxial etch stop layer 305. This epitaxial P+ etch stop layer 305 may also be counterdoped with germanium. The P+ etch stop layer 305 is necessary when the wafer 302 will be thinned chemically. It is recognized that other methods of thinning the wafer 302 may preclude the use of the layer 305 and/or other epitaxial layers. An oxide layer 303 is formed on outer surfaces of the wafer 302. After masking the oxide layer 303 on the epitaxial side of the wafer 302, a wet etch is performed to create a cavity 307 having sidewall 309 forming an angle of about 54.7 degrees, with respect to an upper surface of the wafer 302. After etching the cavity 307, the oxide layer 303 may be stripped. As is shown in FIG. 3B, in this embodiment, outer surfaces of the epitaxial wafer 302 are re-oxidized with an oxidation layer 311. Turning to FIG. 3C, the epitaxial wafer 302 of FIG. 3B is shown bonded, e.g., through a direct silicon bond, to a handle wafer 304 and the oxide layer 311 has been stripped from the backside of the epitaxial wafer 302. As is shown, the oxide layer 311 is still present on the front side of the epitaxial wafer 302. FIG. 3D depicts the wafers 302 and 304, after an etch back has occurred on the backside of the wafer 302 to expose the P+ epitaxial etch stop layer 305. Alternately, the wafer 302 may be thinned by other means to achieve the desired silicon thickness. Next, the P+ epitaxial etch stop layer 305 is removed, leaving only N-type epitaxial layer 306 bonded to handle wafer 304 (see FIG. 3E). Following the removal of the etch stop layer 305, appropriate circuitry can be formed in/on the remaining N-type epitaxial layer 306. As is shown in FIG. 3F, an implant 313, e.g., a piezoresistor, has been formed in the epitaxial wafer 302. Further, dielectric layers 317 and 319 and metal layer(s) 315 have been formed on the epitaxial layer 306, thus, providing an absolute pressure sensor 300.

Figure 3A:
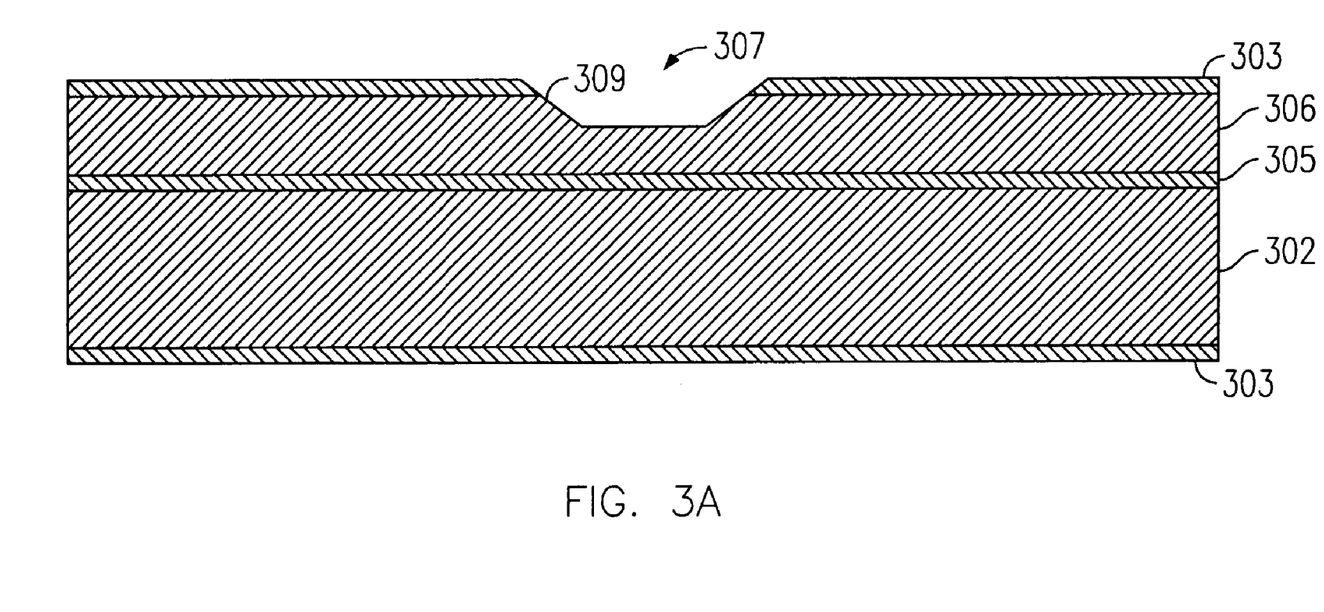
FIGS. 3A–3F are exemplary views of the components of a pressure sensor, manufactured according to one embodiment of the present invention, during manufacturing.
Figure 3B:
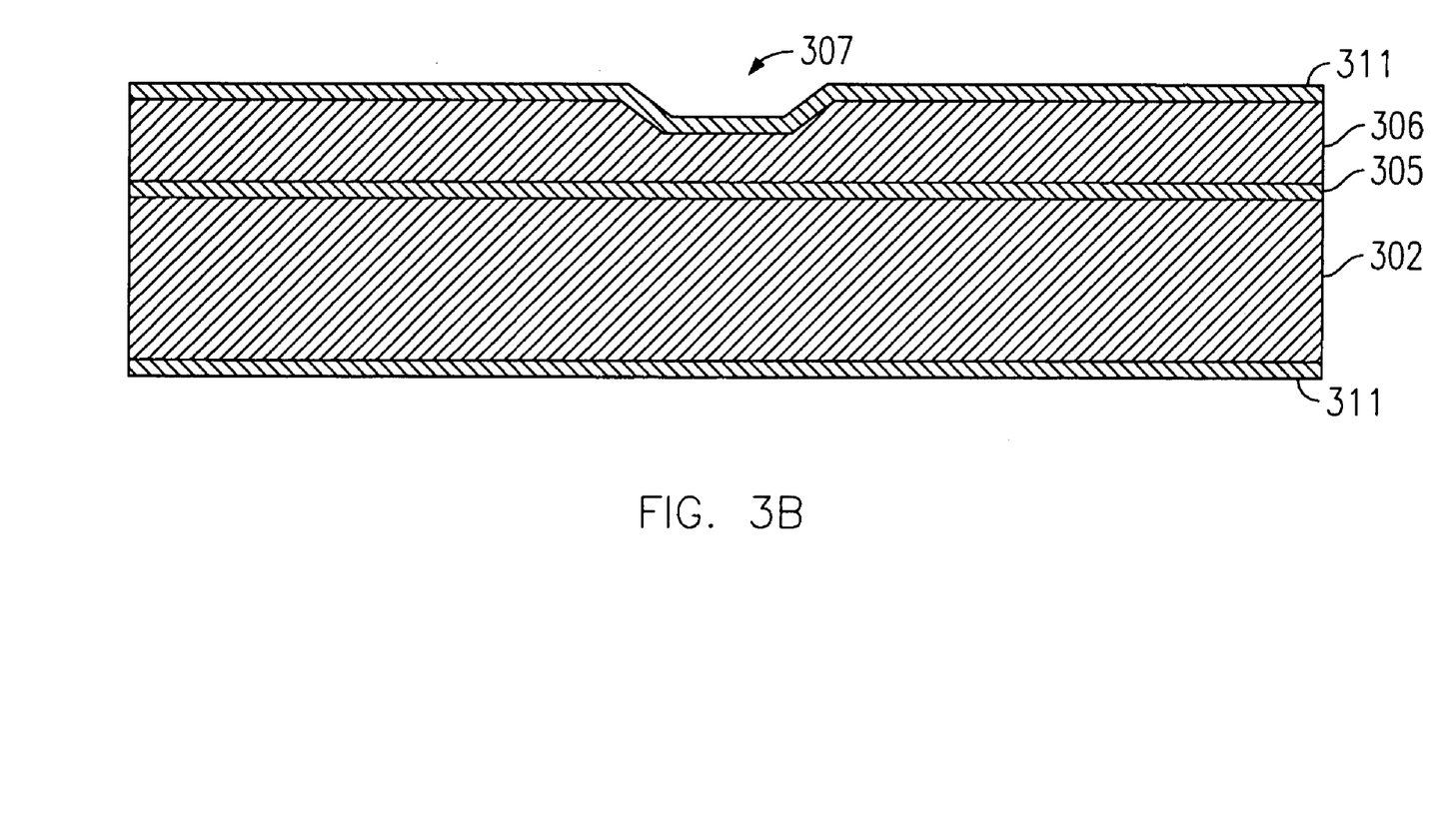
Figure 3C:
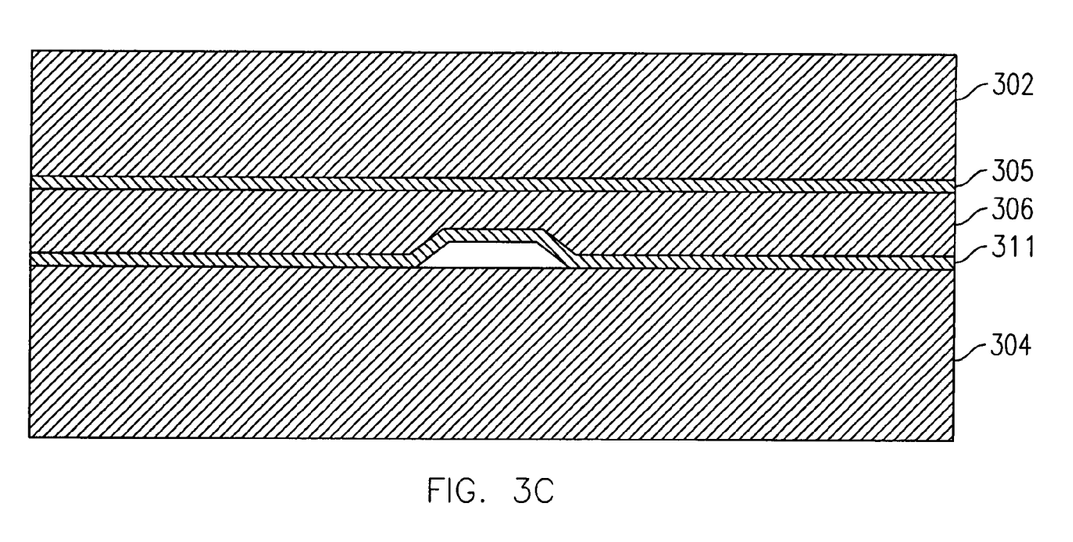
Figure 3D:
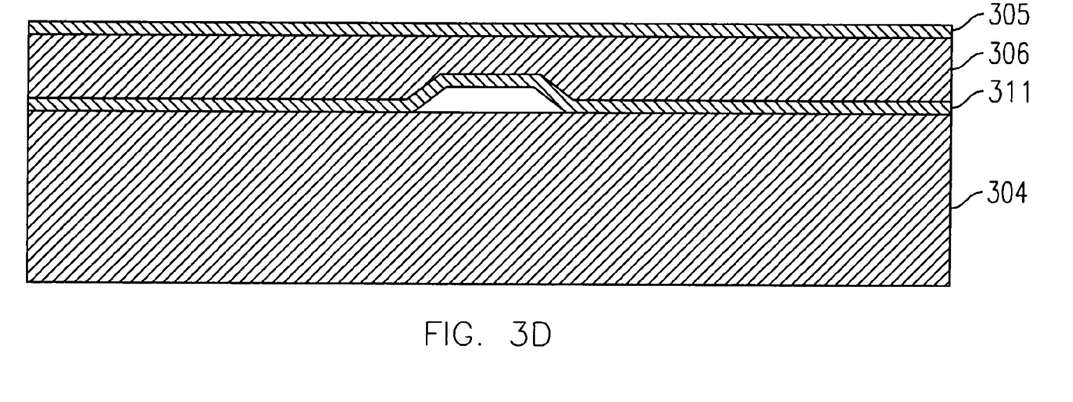
Figure 3E:
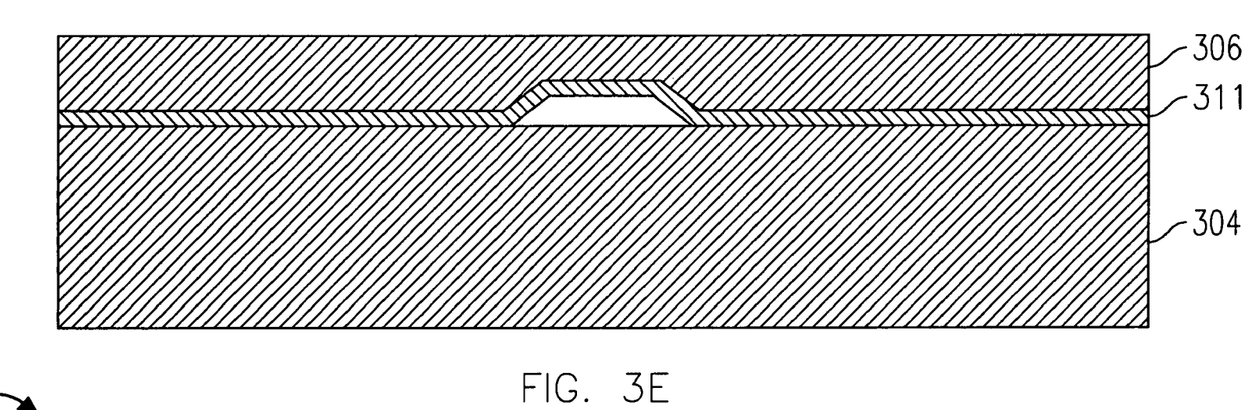
Figure 3F:
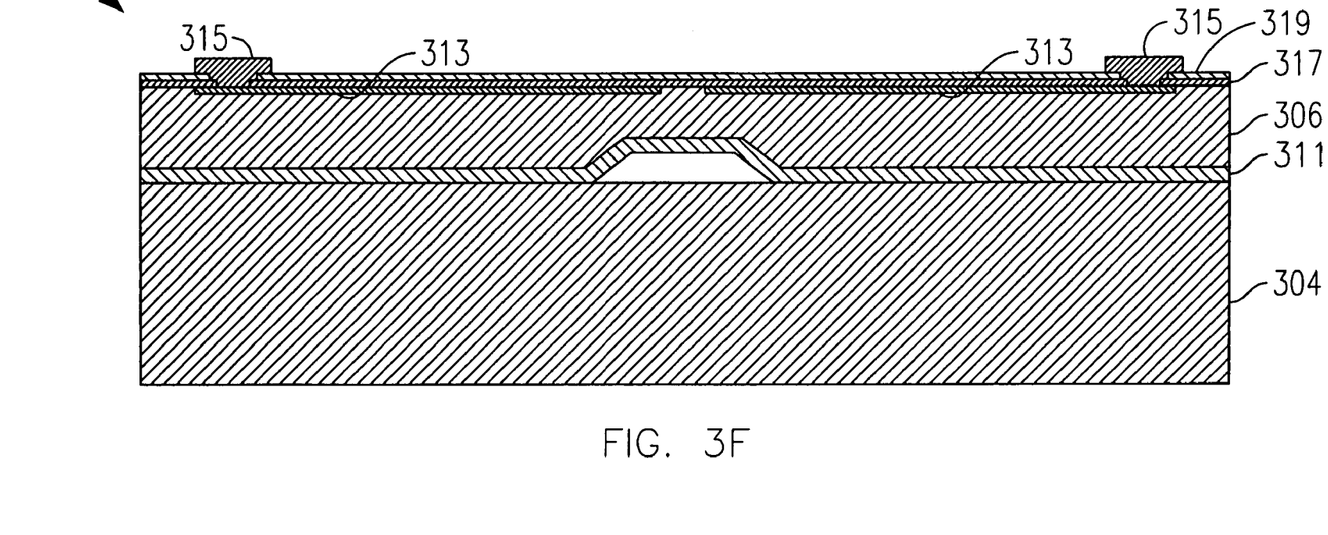
Figure 4:
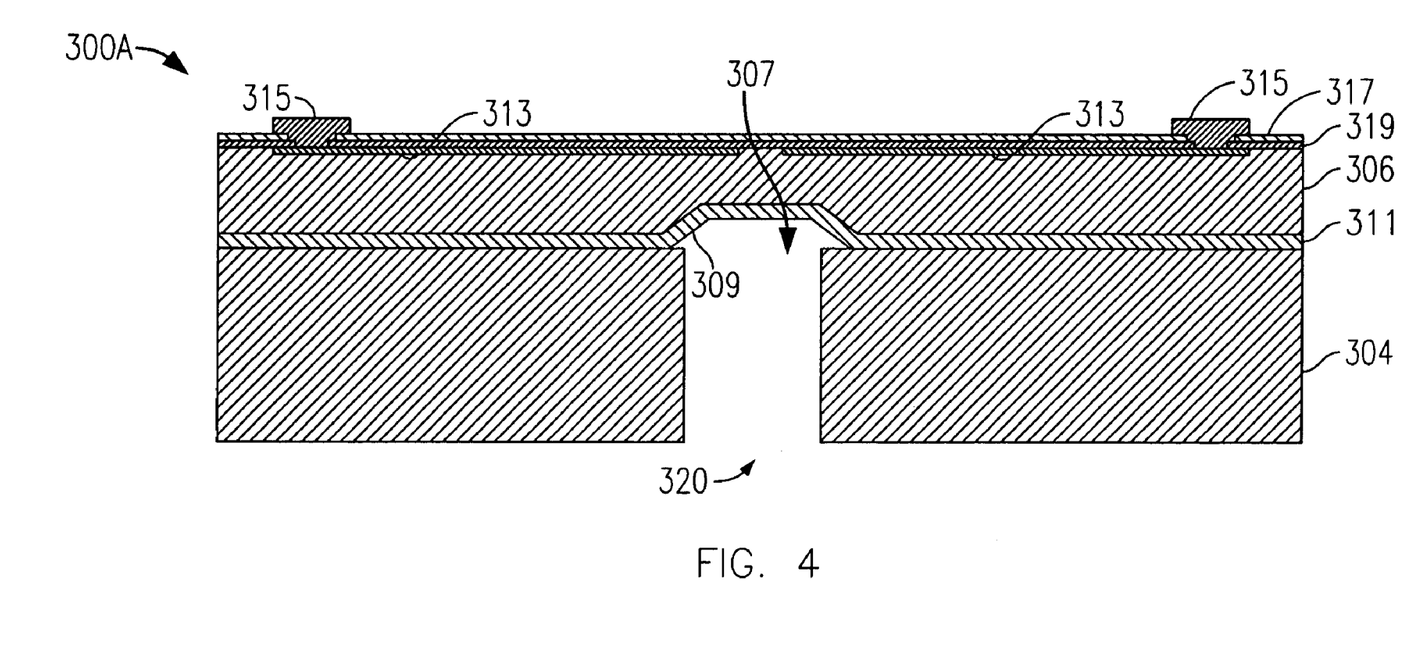
FIG. 4 is a cross-sectional view of a differential pressure sensor formed according to another embodiment of the present invention.

Turning to FIG. 4, a differential pressure sensor 300A is depicted, which is the same as absolute pressure sensor 300 of FIG. 3F, with the exception that a hole 320 has been formed through the backside of the handle wafer 304, via a deep reactive ion etch (DRIE) process. As is shown in FIG. 4, an angle of the sidewall 309 of the cavity 307 is approximately 125.3 degrees, with respect to the membrane, i.e., the N-type epitaxial layer 306 of the pressure sensor 300A.

Figure 5:
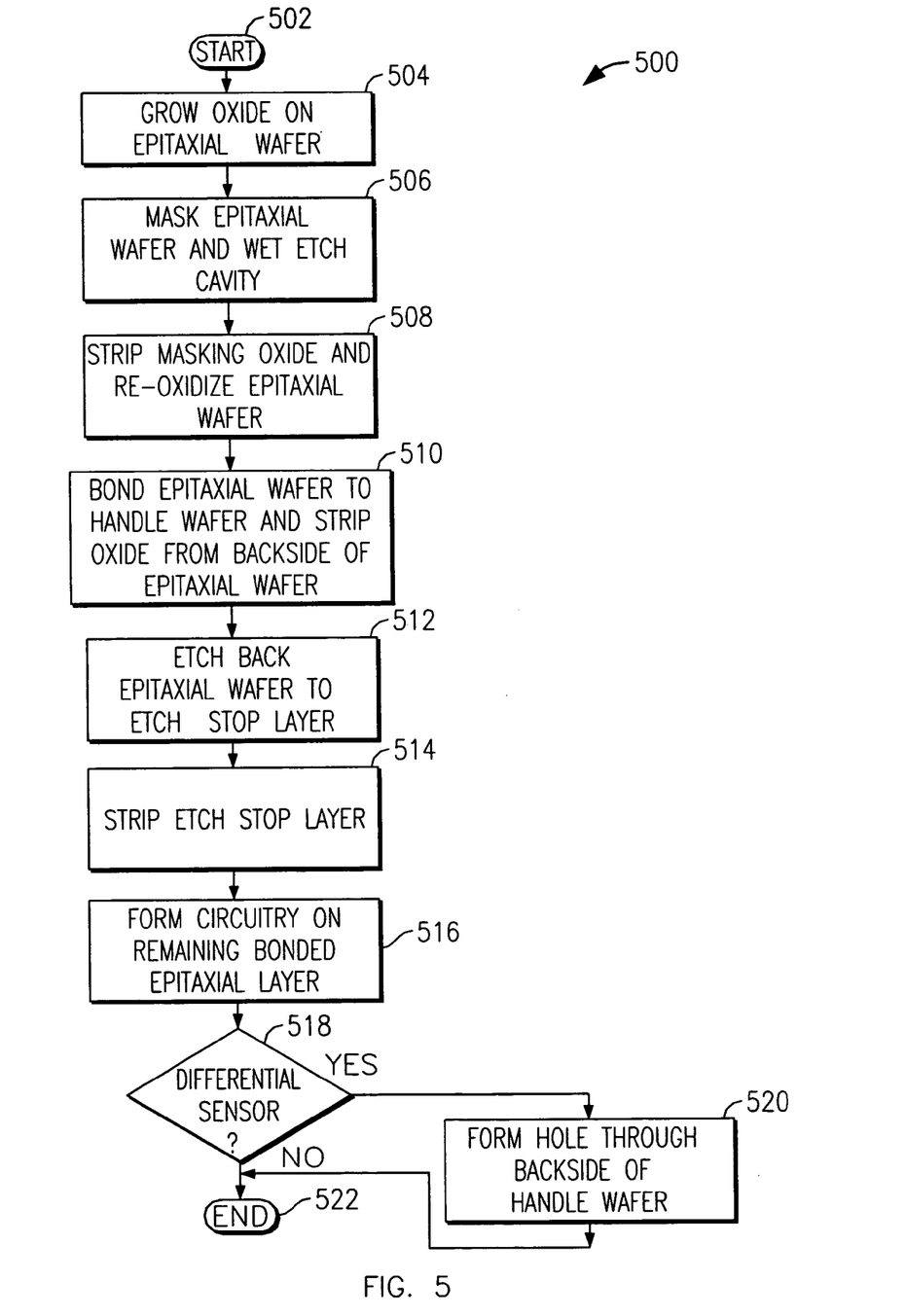
FIG. 5 is a flow chart of a process for producing pressure sensors according to various embodiments of the present invention.

A flow chart for this embodiment of the pressure sensor manufacturing process 500 is shown in FIG. 5. The process 500 is initiated in step 502, at which point the process is continued in step 504, where an oxide layer is grown on the epitaxial wafer 302. Next, in step 506, the epitaxial wafer 302 is masked on one side and a wet etch is initiated to form the cavity 307 in the wafer 302. Then, in step 508, which is optional, the masking oxide 303 is stripped from the wafer 302 and the wafer 302 is re-oxidized with oxide 311. Next, in step 510, the wafer 302 is bonded to the handle wafer 304 and the oxide 311 is stripped from a backside of the wafer 302. Then, in step 512, the backside of the wafer 302 is etched to the etch stop layer 305. Next, in step 514, the etch stop layer 305 is stripped from the wafer 302 leaving N-type epitaxial layer 306, which is bonded to handle wafer 304. It is recognized that if other silicon thinning methods are employed, the use of the P+ etch stop layer may be unnecessary. Then, in step 516, the formation of the circuitry is performed on the N-type epitaxial layer 306. Following step 516, depending upon whether an absolute pressure sensor is going to be produced or a differential pressure sensor is going to be produced, process control transfers from decision step 518 to step 520 or directly to step 522, which terminates the process. When a differential sensor 300A is to be produced, control of the process 500 transfers to step 520, where a hole 320 is formed through the backside of the handle wafer 304 using, for example, a DRIE process.

Accordingly, a technique has been described herein that allows a pressure sensor to be produced with minimal silicon real estate, while providing a membrane that is well supported and, thus, not as fragile as many prior art pressure sensors.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defamed by the following claims as interpreted according to the principles of patent law, including the doctrine of equivalents.

The invention claimed is:

1. A method for manufacturing silicon structures, comprising the steps of:
    etching a cavity into a first side of an epitaxial wafer, wherein a thickness of an epitaxial layer is selected based on a depth of the etched cavity and a membrane thickness;
        bonding the first side of the epitaxial wafer to a first side of a handle wafer;
        removing a portion of the epitaxial wafer to provide the epitaxial layer; and
        forming circuitry on a second side of the epitaxial layer, wherein the second side of the epitaxial layer is opposite the first side of the epitaxial wafer.

2. The method of claim 1, wherein the handle wafer is a non-epitaxial N-type silicon wafer.

3. The method of claim 1, further comprising the step of:
    forming a first oxide layer on outer surfaces of the epitaxial wafer; and
    masking portions of the first oxide layer on the first side of the epitaxial wafer in a pattern, wherein the cavity is etched into the first side of the epitaxial wafer through an unmasked portion of the first oxide layer.

4. The method of claim 2, further comprising the step of:
    removing the first oxide layer from the outer surfaces of the epitaxial wafer; and
    forming a second oxide layer on the exposed silicon surfaces of the epitaxial wafer, before bonding the first side of the epitaxial wafer to the first side of the handle wafer.

5. The method of claim 3, further comprising the step of:
    removing the second oxide layer from the second side of the epitaxial wafer.

6. The method of claim 1, wherein the epitaxial wafer is an N-type silicon wafer.

7. The method of claim 1, wherein the handle wafer is at least one of a P++ type silicon wafer and a silicon wafer having a (111) Miller Indices.

8. The method of claim 4, further comprising the step of:
forming a hole through the handle wafer from a second side of the handle wafer to the first side of the handle wafer approximate the cavity in the epitaxial wafer, wherein the second oxide layer on the second side of the epitaxial wafer functions as an etch stop layer.

9. The method of claim 8, wherein the hole is formed using either wet or dry etch processing.

10. A method for manufacturing silicon structures, comprising the steps of:
    providing an epitaxial wafer including a buried etch stop layer positioned at a depth in the epitaxial wafer;
    etching a cavity into a first side of the epitaxial wafer, wherein a thickness of an epitaxial layer is selected based on a depth of the etched cavity and a membrane thickness, and wherein the membrane thickness is the difference between the location of the buried etch stop layer and the depth of the etched cavity;
    bonding the first side of the epitaxial wafer to a first side of a handle wafer;
    removing a portion of the epitaxial wafer from a second side of the epitaxial wafer until the buried etch stop layer is exposed, wherein the second side of the epitaxial wafer is opposite the first side of the epitaxial wafer;
    removing the etch stop layer from the epitaxial layer; and
    forming circuitry on the second side of the epitaxial layer.

11. The method of claim 9, further comprising the step of:
    forming a first oxide layer on outer surfaces of the epitaxial wafer; and
    masking portions of the first oxide layer on the first side of the epitaxial wafer in a pattern, wherein the cavity is etched into the first side of the epitaxial wafer through an unmasked portion of the first oxide layer.

12. The method of claim 10, further comprising the step of:
    removing the first oxide layer from the outer surfaces of the epitaxial wafer; and
    forming a second oxide layer on the outer surfaces of the epitaxial wafer, before bonding the first side of the epitaxial wafer to the first side of the handle wafer.

13. The method of claim 11, further comprising the step of:
    removing the second oxide layer from the second side of the epitaxial wafer.

14. The method of claim 9, wherein the epitaxial wafer is an N-type silicon wafer and the buried etch stop layer is a P++ type layer.

15. The method of claim 9, wherein the handle wafer is at least one of a P++ type silicon wafer and a silicon wafer having a (111) Miller Indices.

16. The method of claim 12, further comprising the step of:
    forming a hole through the handle wafer from a second side of the handle wafer to the first side of the handle wafer approximate the cavity in the epitaxial wafer, wherein the second oxide layer on the first side of the epitaxial wafer functions as an etch stop layer.

17. The method of claim 16, wherein the hole is formed using either wet or dry etch processing.

18. A method for manufacturing silicon structures, comprising the steps of:
    etching a cavity into a first side of an epitaxial wafer, including a buried etch stop layer positioned at a depth in the epitaxial wafer, wherein a thickness of the epitaxial layer is selected based on a depth of the etched cavity and a membrane thickness;
    bonding the first side of the epitaxial wafer to a first side of a handle wafer;
    thinning the epitaxial wafer until only an epitaxial layer remains; and
    forming circuitry on a second side of the epitaxial layer, wherein the second side of the epitaxial layer is opposite the first side of the epitaxial wafer, and wherein the epitaxial layer is an N-type silicon layer and the buried etch stop layer is a P++ type layer, where the handle wafer is at least one of a P++ type silicon wafer or a silicon wafer having a (111) Miller Indices.

19. The method of claim 17, further comprising the step of:
    forming a first oxide layer on outer surfaces of the epitaxial wafer; and masking portions of the first oxide layer on the first side of the epitaxial wafer in a pattern, wherein the cavity is etched into the first side of the epitaxial wafer through an unmasked portion of the first oxide layer.

20. The method of claim 18, further comprising the step of:

removing the first oxide layer from the outer surfaces of the epitaxial wafer; and forming a second oxide layer on the outer surfaces of the epitaxial wafer, before bonding the first side of the epitaxial wafer to the first side of the handle wafer.

21. The method of claim 19, further comprising the step of:

removing the second oxide layer from the second side of the epitaxial wafer.

* * * * *